(12) United States Patent
Jeon

(10) Patent No.: US 12,514,068 B2
(45) Date of Patent: Dec. 30, 2025

(54) ELECTROLUMINESCENT DISPLAY DEVICE INCLUDING BANK AND LIGHT EMITTING STACK

(71) Applicant: LG Display Co., Ltd., Seoul (KR)

(72) Inventor: HongMyeong Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 489 days.

(21) Appl. No.: 17/981,179

(22) Filed: Nov. 4, 2022

(65) Prior Publication Data

US 2023/0209906 A1   Jun. 29, 2023

(30) Foreign Application Priority Data

Dec. 24, 2021 (KR) .................. 10-2021-0186757

(51) Int. Cl.
*H10K 59/122* (2023.01)
*H10K 50/13* (2023.01)

(52) U.S. Cl.
CPC ......... *H10K 59/122* (2023.02); *H10K 50/131* (2023.02)

(58) Field of Classification Search
CPC .... H10K 59/122; H10K 50/131; H10K 50/16; H10K 50/171; H10K 50/19; H10K 50/15; H10K 50/17
See application file for complete search history.

(56) References Cited

U.S. PATENT DOCUMENTS

| | | | |
|---|---|---|---|
| 7,656,084 B2 * | 2/2010 | Ishida | H10K 50/19 |
| | | | 313/506 |
| 7,733,010 B2 | 6/2010 | Lee et al. | |
| 9,773,848 B2 | 9/2017 | Shinokawa et al. | |
| 2016/0190521 A1 | 6/2016 | Lee et al. | |
| 2017/0278914 A1 | 9/2017 | Cui et al. | |
| 2018/0190740 A1 * | 7/2018 | Bang | H10K 59/38 |
| 2020/0203448 A1 * | 6/2020 | Kim | H10K 59/35 |
| 2023/0172005 A1 * | 6/2023 | Park | H10K 59/874 |
| | | | 257/40 |

FOREIGN PATENT DOCUMENTS

| | | |
|---|---|---|
| CN | 109962087 A | 7/2019 |
| CN | 112331697 A | 2/2021 |
| JP | 2005251529 A | 9/2005 |

(Continued)

*Primary Examiner* — Nduka E Ojeh
(74) *Attorney, Agent, or Firm* — Seed Intellectual Property Law Group LLP

(57) ABSTRACT

Disclosed is an electroluminescent display device comprising a substrate including a first subpixel and a second subpixel arranged in a first direction, a first electrode provided in each of the first subpixel and the second subpixel on the substrate, a bank provided in the boundary area between the first subpixel and the second subpixel on the substrate, a light emitting stack provided on the first electrode and the bank, and a second electrode provided on the light emitting stack, wherein the bank includes a first bank and a second bank provided on the first bank, the light emitting stack includes a first layer provided in the first subpixel and the second subpixel, and a second layer disposed on the first layer and provided from the first subpixel to the second subpixel, the first bank is disposed under the second layer, and the second bank is disposed on the second layer.

29 Claims, 9 Drawing Sheets

(56) References Cited

FOREIGN PATENT DOCUMENTS

| | | | |
|---|---|---|---|
| JP | 2007299741 | A | 11/2007 |
| JP | 2010170767 | A | 8/2010 |
| JP | 4540747 | B2 | 9/2010 |
| JP | 2011090909 | A | 5/2011 |
| JP | 2011096375 | A | 5/2011 |
| JP | 2012256587 | A | 12/2012 |
| KR | 101696476 | B1 | 1/2017 |
| WO | 2012001741 | A1 | 1/2012 |
| WO | 2015072063 | A1 | 5/2015 |

* cited by examiner

ELECTROLUMINESCENT DISPLAY DEVICE INCLUDING BANK AND LIGHT EMITTING STACK

CROSS-REFERENCE TO RELATED APPLICATIONS

This application claims the benefit of and priority to the Korean Patent Application No. 10-2021-0186757, filed on Dec. 24, 2021, which is herein incorporated by reference in its entirety.

BACKGROUND

Technical Field

The present disclosure relates to an electroluminescent display device, and more particularly, to an electroluminescent display device fabricated by a solution process.

Description of the Related Art

The electroluminescent display device includes a first electrode, a second electrode, and a light emitting stack provided between the first electrode and the second electrode, wherein the light emitting stack emits light by an electric field between the two electrodes, thereby displaying an image.

The light emitting stack may include an organic material that emits light as excitons are annihilated due to the recombination of electrons and holes. An exciton is an electrically neutral quasi-particle comprising an electron and a hole that are electrostatically coupled. An exciton may be generated when the organic material absorbs a photon of higher energy than its bandgap, which may excite an electron from the valence band into the conduction band. When a conduction band electron in an exciton recombines with a valence band hole, the exciton disappears and the energy of the exciton may be converted into light.

BRIEF SUMMARY

In some embodiments, the light emitting stack may be formed using a vacuum deposition process. In this case, vacuum deposition equipment may be required which may increase manufacturing costs, and in particular, the size of a mask and a vacuum deposition apparatus for forming a pattern in the case of a large-type electroluminescent display device may become larger, thereby reducing productivity in mass production.

Accordingly, in order to reduce manufacturing costs, a light emitting stack may be formed by a solution process using inkjet equipment or the like.

However, when the light emitting stack is formed by a solution process, as an example, a solution for forming the red light emitting stack may flow from the red subpixel to the green subpixel adjacent to the red subpixel so that the image quality of the green subpixel may be deteriorated.

An aspect of the present disclosure is to provide an electroluminescent display device fabricated by a solution process and configured to prevent a light emitting stack of any one subpixel from flowing to another adjacent subpixel for the solution process.

In accordance with an aspect of the present disclosure, the above may be accomplished by the provision of an electroluminescent display device comprising a substrate including a first subpixel and a second subpixel arranged in a first direction, a first electrode provided in each of the first subpixel and the second subpixel on the substrate, a bank provided in the boundary area between the first subpixel and the second subpixel on the substrate, a light emitting stack provided on the first electrode and the bank, and a second electrode provided on the light emitting stack, wherein the bank includes a first bank and a second bank provided on the first bank, the light emitting stack includes a first layer provided in each of the first subpixel and the second subpixel, and a second layer disposed on the first layer and continuously provided from the first subpixel to the second subpixel, and the first bank is disposed under the second layer, and the second bank is disposed on the second layer.

In accordance with another aspect of the present disclosure, the above may be accomplished by the provision of an electroluminescent display device comprising a substrate including a plurality of first subpixels and a plurality of second subpixels, a first bank provided in the boundary area between the plurality of first subpixels and the plurality of second subpixels, the boundary area between each of the plurality of first subpixels, and the boundary area between each of the plurality of second subpixels, a second bank provided in a continuous linear structure along the boundary area between the plurality of first subpixels and the plurality of second subpixels, and a third bank provided in a discontinuous linear structure in the boundary area between each of the plurality of first subpixels and the boundary area between each of the plurality of second subpixels.

DETAILED DESCRIPTION

Hereinafter, embodiments of the present disclosure will be described in detail with reference to the accompanying drawings.

Figure 1:
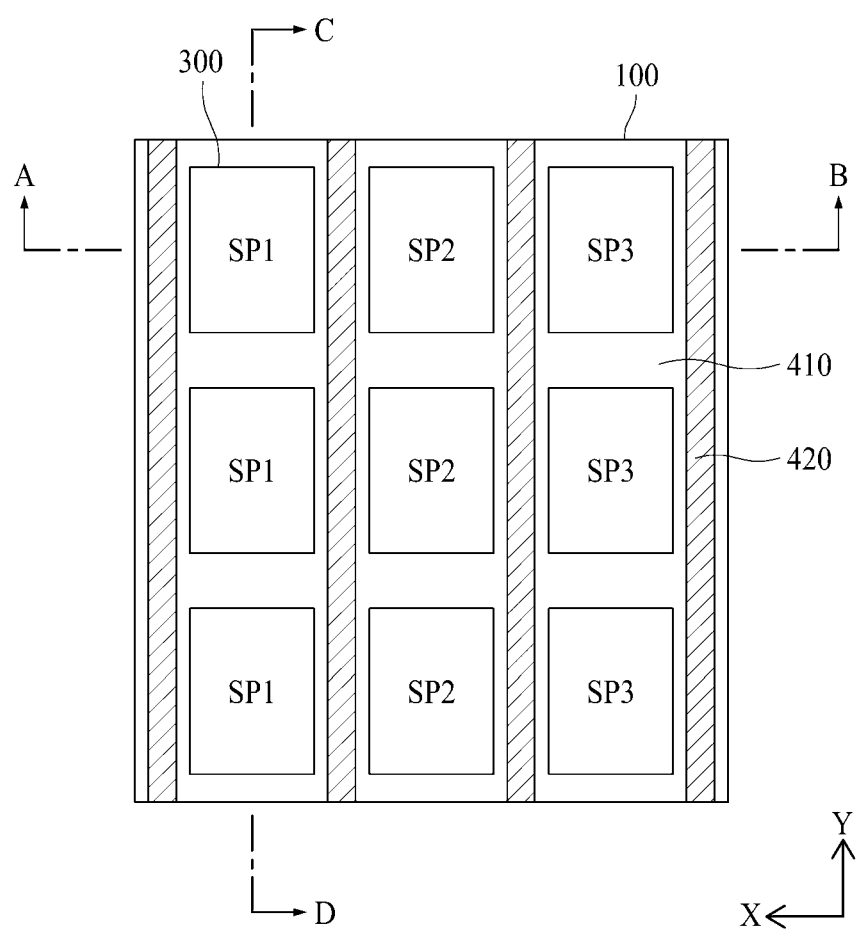
FIG. 1 is a plan view illustrating an electroluminescent display device according to one embodiment of the present disclosure.

FIG. 1 is a schematic plan view of an electroluminescent display device according to one embodiment of the present disclosure.

As shown in FIG. 1, the electroluminescent display device according to one embodiment of the present disclosure includes a substrate 100, a plurality of subpixels SP1, SP2, and SP3 on the substrate 100, a first electrode 300 on each of the plurality of subpixels SP1, SP2, and SP3, and banks 410 and 420 provided in the boundary area between the plurality of subpixels SP1, SP2 and SP3.

The plurality of subpixels SP1, SP2, and SP3 may include a first subpixel SP1, a second subpixel SP2, and a third subpixel SP3 arranged in a first direction, e.g., in the X-axis direction. Light of a first color is emitted from the first subpixel SP1, light of a second color is emitted from the second subpixel SP2, and light of a third color may be emitted from the third subpixel SP3.

The plurality of first subpixels SP1 may be arranged in a second direction crossing the first direction, e.g., in the Y-axis direction. Similarly, the plurality of second subpixels SP2 and the plurality of third subpixels SP3 may be arranged in the second direction.

The arrangement of the plurality of subpixels SP1, SP2 and SP3 may be changed in various forms generally known to those in the art.

The first electrode 300 may function as an anode of the electroluminescent display device, and the first electrode 300 may be patterned in each of the plurality of subpixels SP1, SP2, and SP3, and may be surrounded by the banks 410 and 420.

The banks 410 and 420 may be provided in the boundary area between the plurality of subpixels SP1, SP2 and SP3, to thereby define regions of the individual subpixels SP1, SP2, and SP3.

The banks 410 and 420 include a first bank 410 and a second bank 420.

The first bank 410 may be formed in a mesh structure in the boundary area between the plurality of subpixels SP1, SP2, and SP3. Specifically, the first bank 410 may be formed in the boundary area between each of the first subpixel SP1, the second subpixel SP2, and the third subpixel SP3 arranged in the first direction, the boundary area between the plurality of first subpixels SP1 arranged in the second direction, the boundary area between the plurality of second subpixels SP2 arranged in the second direction, and the boundary area between the plurality of third subpixels SP3 arranged in the second direction.

The second bank 420 may be formed in a different pattern from the first bank 410. Specifically, the second bank 420 may be formed in the boundary area between each of the first subpixel SP1, the second subpixel SP2, and the third subpixel SP3 arranged in the first direction, but may not be formed in the boundary area between the plurality of first subpixels SP1 arranged in the second direction, the boundary area between the second subpixels SP2 arranged in the second direction, and the plurality of third subpixels SP3 arranged in the second direction. Accordingly, the second bank 420 may extend in the second direction and may be formed in a stripe structure spaced apart by a predetermined distance in the first direction.

Figure 2:
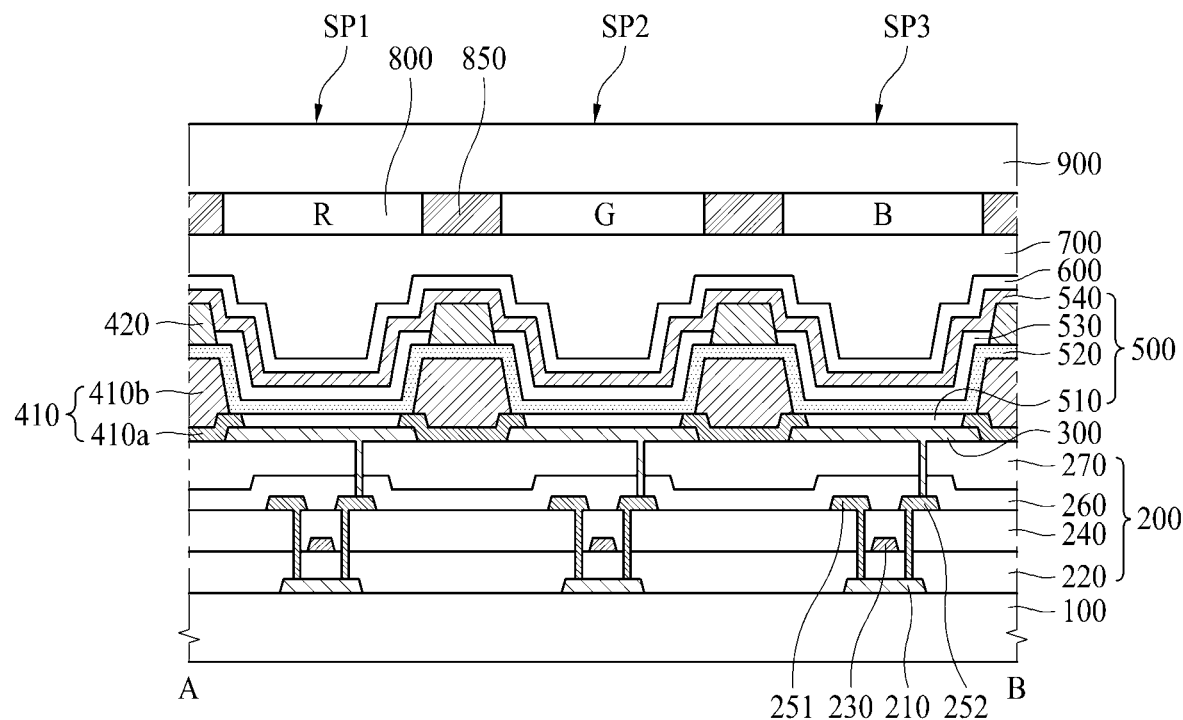
FIG. 2 is a schematic cross-sectional view of the electroluminescent display device according to one embodiment of the present disclosure, which corresponds to a cross-sectional view along A-B line of FIG. 1.

FIG. 2 is a schematic cross-sectional view of the electroluminescent display device according to one embodiment of the present disclosure, which corresponds to the cross section along A-B line of FIG. 1. That is, FIG. 2 is the cross-sectional view including the boundary area between each of the first subpixel SP1, the second subpixel SP2, and the third subpixel SP3 which emit light of different colors.

As shown in FIG. 2, the electroluminescent display device according to one embodiment of the present disclosure includes the substrate 100, a circuit element layer 200, the first electrode 300, the bank 410 and 420, a light emitting stack 500, a second electrode 600, an encapsulation layer 700, a color filter 800, a light shielding layer 850, and a protective layer 900.

The substrate 100 may be made of glass or transparent plastic, but is not limited thereto, but may be made of a semiconductor material such as a silicon wafer. If the electroluminescent display device according to one embodiment of the present disclosure is formed in a top emission type, an opaque material as well as a transparent material may be used as a material of the substrate 100.

However, if the electroluminescent display device according to one embodiment of the present disclosure is formed in a bottom emission type, a transparent material is used as a material of the substrate 100.

The circuit element layer 200 is formed on the substrate 100.

The circuit element layer 200 includes a driving thin film transistor.

The driving thin film transistor includes an active layer 210 on the substrate 100, a gate insulating film 220 on the active layer 210, a gate electrode 230 on the gate insulating film 220, an interlayer insulating film 240 on the gate electrode 230, and a source electrode 251 and a drain electrode 252 disposed on the interlayer insulating film 240 and connected to the active layer 210 through a hole formed in the interlayer insulating film 240 and the gate insulating film 220. Although it shows the driving thin film transistor of the top gate structure where the gate electrode 230 is provided above the active layer 210, the present disclosure may include the driving thin film transistor of the bottom gate structure where the gate electrode 230 is provided below the active layer 210.

The circuit element layer 200 may further include a passivation layer 260 and a planarization layer 270 provided on or above the driving thin film transistor. The passivation layer 260 is formed on the source electrode 251 and the drain electrode 252, and the planarization layer 270 is formed on the passivation layer 260.

The passivation layer 260 and the planarization layer 270 may include the contact hole, and the first electrode 300 may be connected to the drain electrode 252 through the contact hole. If needed, the first electrode 300 may be connected to the source electrode 251 through the contact hole.

The circuit element layer 200 may further include various signal lines including a gate line, a data line, a power line, and a reference wire, various thin film transistors including a switching thin film transistor and a sensing thin film transistor, and a capacitor.

In some cases, the switching thin film transistor is switched according to a gate signal supplied to the gate line, and is configured to supply a data voltage supplied from the data line to the driving thin film transistor.

In some cases, the driving thin film transistor is switched according to a data voltage supplied from the switching thin film transistor, generates a data current from a power source supplied from the power line, and supplies the data current to the first electrode 300.

In some cases, the sensing thin film transistor senses a threshold voltage deviation of the driving thin film transistor, which may cause degradation of image quality, and supplies a current of the driving thin film transistor to the reference line in response to a sensing control signal supplied from the gate line or a separate sensing line.

The capacitor maintains the data voltage supplied to the driving thin film transistor during one frame, and is connected to a gate terminal and a source terminal of the driving thin film transistor, respectively.

Each of the switching thin film transistor, the driving thin film transistor, and the sensing thin film transistor may be changed into various structures known in the art, such as a bottom gate structure or a top gate structure.

Also, the circuit element layer 200 may further include a passivation layer for protecting the switching thin film transistor, the driving thin film transistor, and the sensing thin film transistor, and a planarization layer provided on the passivation layer.

The first electrode 300 is formed on the circuit element layer 200 for each subpixel SP1, SP2, and SP3. The first electrode 300 may function as an anode of the electroluminescent display device. The first electrode 300 may include a transparent electrode when the electroluminescence display device according to the present disclosure is the bottom emission type, and the first electrode 300 may include a reflective electrode when the electroluminescent display device according to the present disclosure is the top emission type.

The banks 410 and 420 are provided on the circuit element layer 200, and the banks 410 include a first bank 410 and a second bank 420.

The first bank 410 is formed to cover both ends of the first electrode 300 on the circuit element layer 200, and is formed in the boundary area between the plurality of subpixels SP1, SP2 and SP3.

The first bank 410 may be formed in a two-layered structure of a lower bank layer 410*a* and an upper bank layer 410*b*.

The lower bank layer 410*a* may be formed to be in contact with the first electrode 300 and the circuit element layer 200. The lower bank layer 410*a* may be thinner than the upper bank layer 410*b*, and may be wider than the upper bank layer 410*b*. The lower bank layer 410*a* may be formed of a hydrophilic material, but not limited thereto. The lower bank layer 410*a* may be made of a hydrophobic material.

The upper bank layer 410*b* is patterned on the lower bank layer 410*a*. The upper bank layer 410*b* may be formed in the boundary area between the first subpixel SP1 and the second subpixel SP2 and the boundary area between the second subpixel SP2 and the third subpixel SP3, but may not be formed in the boundary area between the plurality of first subpixels SP1, the boundary area between the plurality of second subpixels SP2, and the boundary area between the plurality of third subpixels SP3.

The upper bank layer 410*b* may be formed by applying a solution obtained by mixing a hydrophobic material, such as fluorine, to an organic insulating material having hydrophilicity, and forming a pattern through a photolithography process. The hydrophobic material, such as fluorine, may be moved to the top of the upper bank layer 410*b* by the light irradiated during the photolithography process, whereby the top of the upper bank layer 410*b* may have a hydrophobic property and the other portion may have a hydrophilic property. That is, a portion of the upper bank layer 410*b* contacting the lower bank layer 410*a* may have a hydrophilic property, and an upper portion of the upper bank layer 410*b* may have a hydrophobic property, but not limited thereto. The entire portion of the upper bank layer 410*b* may have a hydrophobic property. As described above, due to the upper bank layer 410*b* having the hydrophobic property, it is possible to prevent the solution from spreading to the light emitting stack 500, and more particularly, spreading and mixed between the adjacent subpixels SP1, SP2, and SP3.

The second bank 420 is formed in the boundary area between the plurality of subpixels SP1, SP2 and SP3 while being provided above the first bank 410. A second layer 520 of the light emitting stack 500 is disposed between the second bank 420 and the first bank 410, whereby the second bank 420 does not contact the first bank 410. The width of the second bank 420 may be smaller than the width of the first bank 410, but is not limited thereto. The light emitting stack 500 can include a number of layers comprised of different materials, some of which emit light and some of which do not emit light, but facilitate the emission of light by other layers in the light emitting stack 500. For example, the light emitting stack 500 can include one or more organic light emitting stacks, and also include one or more the following layers: a hole injection layer, a hole transporting layer, a charge generation layer, an electron transporting layer and/or an electron injection layer.

The second bank 420 may be formed of the same material as the upper bank layer 410*b* by the same process, whereby the lower portion of the second bank 420 may have a hydrophilic property, and the upper portion of the second bank 420 may have a hydrophobic property. Also, the entire portion of the second bank 420 may have a hydrophobic property. As described above, owing to the upper portion of the second bank 420 having the hydrophobic property, it is possible to prevent a solution for forming a third layer 530 of the light emitting stack 500 from spreading to the neighboring subpixels SP1, SP2, and SP3, and being mixed in the neighboring subpixels SP1, SP2, and SP3.

The light emitting stack 500 is formed on the first electrode 300 and the banks 410 and 420. The light emitting stack 500 includes a first layer 510, a second layer 520, a third layer 530, and a fourth layer 540, which are sequentially stacked.

The first layer 510 is formed by a solution process using an inkjet equipment on the first electrode 300. The first layer 510 includes an emitting layer of an organic material that may cause light emission.

The first layer 510 is patterned in the plurality of subpixels SP1, SP2, and SP3, and is disconnected in the plurality of subpixels SP1, SP2 and SP3. That is, the first layer 510 in the first subpixel SP1, the first layer 510 in the second subpixel SP2, and the first layer 510 in the third subpixel SP3 are disconnected without being connected to each other, thereby preventing light emission in the boundary area between the subpixels SP1, SP2 and SP3.

Since the upper portion of the upper bank layer 410*b* has a hydrophobic property, the first layer 510 is not spread to the upper portion of the upper bank layer 410*b* and is patterned in each of the plurality of subpixels SP1, SP2, and SP3 as the disconnected state in the plurality of subpixels SP1, SP2, and SP3.

The first layer 510 may be formed to be in contact with the lower bank layer 410*a* of the first bank 410. Although not shown in detail, the first layer 510 may extend to the upper bank layer 410*b* of the first bank 410 and may be in contact with the side surface of the upper bank layer 410*b*.

The second layer 520 may be formed by a deposition process, such as evaporation, on the first layer 510. The second layer 520 may include a functional layer for injecting or transporting electrons or a functional layer for generating electric charges without including a light emitting stack of an organic material causing light emission.

The second layer 520 may be formed to be continuous without being disconnected from the inner portion of the plurality of subpixels SP1, SP2, and SP3 and the entire boundary area between the plurality of subpixels SP1, SP2, and SP3. Thus, the second layer 520 in the first subpixel SP1, the second layer 520 in the second subpixel SP2, and the second layer 520 in the third subpixel SP3 are connected to each other without being disconnected from each other. In other words, the second layer 520 is continuous from the first subpixel SP1 to the third subpixel SP3. The entire upper surface of the first bank 410 may be covered by the second layer 520.

The third layer 530 is formed by a solution process using an inkjet equipment on the second layer 520. The third layer 530 includes an emitting layer of an organic material causing light emission.

The third layer 530 is patterned in each of the plurality of subpixels SP1, SP2 and SP3, and is disconnected in the plurality of subpixels SP1, SP2 and SP3. That is, the third layer 530 in the first subpixel SP1, the third layer 530 in the second subpixel SP2, and the third layer 530 in the third subpixel SP3 are disconnected without being connected to each other, thereby preventing light emission in the boundary area between the subpixels SP1, SP2 and SP3.

According to one embodiment of the present disclosure, the second bank 420 is additionally formed on the upper surface of the second layer 520 before the third layer 530 is formed, whereby the third layer 530 is disconnected in the plurality of subpixels SP1, SP2 and SP3 without the connection in the plurality of subpixels SP1, SP2, and SP3.

In more detail, the second layer 520 is formed to be continuous in the boundary area between the plurality of subpixels SP1, SP2 and SP3, and the upper surface of the second layer 520 is not hydrophobic. Therefore, when the third layer 530 is formed on the upper surface of the second layer 520 by a solution process without additionally forming the second bank 420, the third layer 530 may flow to the boundary area between the plurality of subpixels SP1, SP2, and SP3. In this case, since the third layer 530 is formed to be continuous between the adjacent subpixels SP1, SP2 and SP3, a problem in which light emission occurs in the boundary area between the plurality of subpixels SP1, SP2 and SP3 may occur.

Therefore, in one embodiment of the present disclosure, the second bank 420 is additionally formed on the upper surface of the second layer 520, and the upper portion of the second bank 420 has a hydrophobic property so that the third layer 530 is prevented from being spread to the upper surface of the second bank 420 when the third layer 530 is formed by a solution process, such by an ink jet printing method. Accordingly, the third layer 530 is patterned in the disconnected state without being continuous in the plurality of subpixels SP1, SP2, and SP3, so that it is possible to prevent a problem in which light emission occurs in the boundary area between the plurality of subpixels SP1, SP2 and SP3.

The fourth layer 540 may be formed by a deposition process, such as evaporation, on the third layer 530. The fourth layer 540 may include a functional layer for injecting or transporting electrons instead of including a light emitting stack of an organic material causing light emission. The fourth layer 540 may be formed to be continuous without being disconnected in the inner portion of the plurality of subpixels SP1, SP2, and SP3 and the entire boundary area between the plurality of subpixels SP1, SP2, and SP3. Accordingly, the fourth layer 540 in the first subpixel SP1, the fourth layer 540 in the second subpixel SP2, and the fourth layer 540 in the third subpixel SP3 are connected to each other without being disconnected from each other. In other words, the fourth layer 540 is continuous from the first subpixel SP1 to the third subpixel SP3. The entire upper surface of the second bank 420 may be covered by the fourth layer 540.

Figure 3:
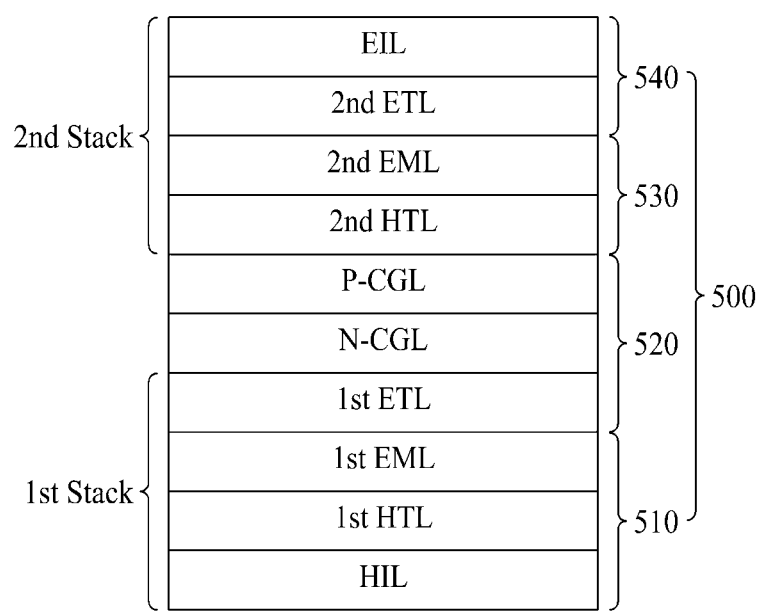
FIG. 3 is a schematic cross-sectional view of an emission layer according to one embodiment of the present disclosure.

FIG. 3 is a schematic cross-sectional view of the light emitting stack 500 according to one embodiment of the present disclosure. The light emitting stack 500 can be composed of a number of layers as well as a number of different stacks and substacks. Various embodiments for the light emitting stack 500 will are described herein.

As shown in FIG. 3, the light emitting stack 500 according to one embodiment of the present disclosure includes a first stack $1^{st}$ Stack for emitting light of a first color, a second stack $2^{nd}$ Stack for emitting light of a second color, and a charge generating layer N-CGL and P-CGL disposed between the first stack $1^{st}$ Stack and the second stack $2^{nd}$ Stack. Light of the first color emitted from the first stack $1^{st}$ Stack and light of the second color emitted from the second stack $2^{nd}$ Stack may be mixed to emit white light in the light emitting stack 500.

The first stack $1^{st}$ Stack includes a hole injection layer HIL, a first hole transport layer $1^{st}$ HTL, a first light emitting stack $1^{st}$ EML, and a first electron transport layer $1^{st}$ ETL. The second stack $2^{nd}$ Stack includes a second hole transport layer $2^{nd}$ HTL, a second light emitting stack $2^{nd}$ EML, a second electron transport layer $2^{nd}$ ETL, and an electron injection layer EIL.

In some cases, the first light emitting stack $1^{st}$ EML emits blue light and the second light emitting stack $2^{nd}$ EML emits yellow green light. Alternatively, the first light emitting stack $1^{st}$ EML emits yellow green light and the second light emitting stack $2^{nd}$ EML emits blue light.

The charge generating layer N-CGL and P-CGL includes an N-type charge generating layer N-CGL and a P-type charge generating layer P-CGL. The N-type charge generating layer N-CGL is formed on the first stack $1^{st}$ Stack and is configured to provide electrons to the first stack $1^{st}$ Stack, and the P-type charge generating layer P-CGL is formed on the N-type charge generating layer N-CGL and is configured to provide holes to the second stack $2^{nd}$ Stack.

Referring to FIG. 2, the first layer 510 formed by the solution process may include some layers of the first stack $1^{st}$ Stack. More particularly, the first layer 510 may include the hole injection layer HIL, the first hole transport layer $1^{st}$ HTL, and the first light emitting stack $1^{st}$ EML.

The second layer 520 formed by the deposition process may include the remaining layers of the first stack $1^{st}$ Stack and the charge generating layer N-CGL and P-CGL. More particularly, the second layer 520 may include the first electron transport layer $1^{st}$ ETL, the N-type charge generating layer N-CGL, and the P-type charge generating layer P-CGL.

The third layer 530, which is formed by the solution process, may include some layers of the second stack $2^{nd}$ Stack. More particularly, the third layer 530 may include the second hole transport layer $2^{nd}$ HTL and the second light emitting stack $2^{nd}$ EML.

The fourth layer 540, which may be formed by the deposition process, may include the remaining layers of the second stack $2^{nd}$ Stack. More particularly, the fourth layer 540 may include the second electron transport layer $2^{nd}$ ETL and the electron injection layer EIL.

When the upper layer of the first light emitting stack $1^{st}$ EML is formed by the solution process, the first light emitting stack $1^{st}$ EML may be adversely affected by the solvent in the solution, so that the upper layer of the first light emitting stack $1^{st}$ EML may be formed by the deposition process, preferably. Similarly, it may be desirable to form the upper layer of the second light emitting stack $2^{nd}$ EML by the deposition process. For this reason, the second layer 520 and the fourth layer 540 may be formed by the deposition process instead of the solution process.

Referring once again to FIG. 2, the second electrode 600 is formed on the light emitting stack 500. The second electrode 600 may be formed to be continuous without being disconnected in the inner portion of the plurality of subpixels SP1, SP2, and SP3 and the entire boundary area between the plurality of subpixels SP1, SP2, and SP3. The second electrode 600 may function as a cathode of the electroluminescent display device. The second electrode 600 may be formed of a transparent electrode or a semi-transparent electrode when the electroluminescent display device according to the present disclosure is the top emission type, and the second electrode 600 may be formed of a reflective electrode when the electroluminescent display device according to the present disclosure is the bottom emission type.

The encapsulation layer 700 is formed on the second electrode 600 and is configured to prevent external moisture or oxygen from penetrating into the light emitting stack 500.

The color filter 800 and the light shielding layer 850 may be formed on the encapsulation layer 700. The color filter 800 may include a red R color filter provided in the first subpixel SP1, a green G color filter provided in the second subpixel SP2, and a blue B color filter provided in the third subpixel SP3. The light shielding layer 850 may be formed in the boundary area between the red R color filter, the green G color filter, and the blue B color filter, that is, the boundary area between the plurality of subpixels SP1, SP2, and SP3.

When the electroluminescent display device according to one embodiment of the present disclosure is the top emission type, the color filter 800 and the light shielding layer 850 may be formed on the upper surface of the encapsulation layer 700, as shown in the drawings. However, when the electroluminescent display device according to one embodiment of the present disclosure is the bottom emission type, the color filter 800 and the light shielding layer 850 may be formed below the light emitting stack 500, and more particularly, in the circuit element layer 200. The protective layer 900 may be formed on the color filter 800 and the light shielding layer 850, to thereby protect internal components from external impacts.

Figure 4:
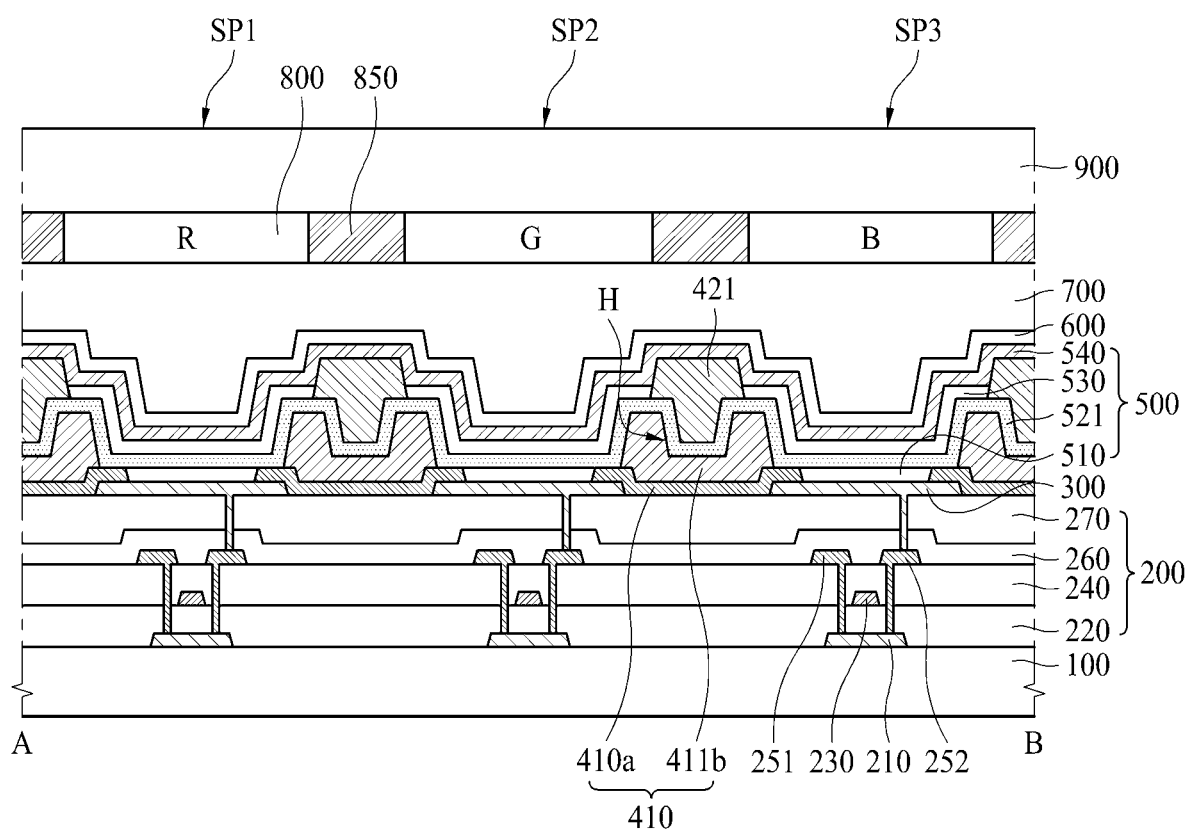
FIGS. 4 to 6 are schematic cross-sectional views illustrating electroluminescent display devices according to various embodiments of the present disclosure, which illustrate a portion of a boundary area between a first sub pixel and a second sub pixel.
Figure 5:
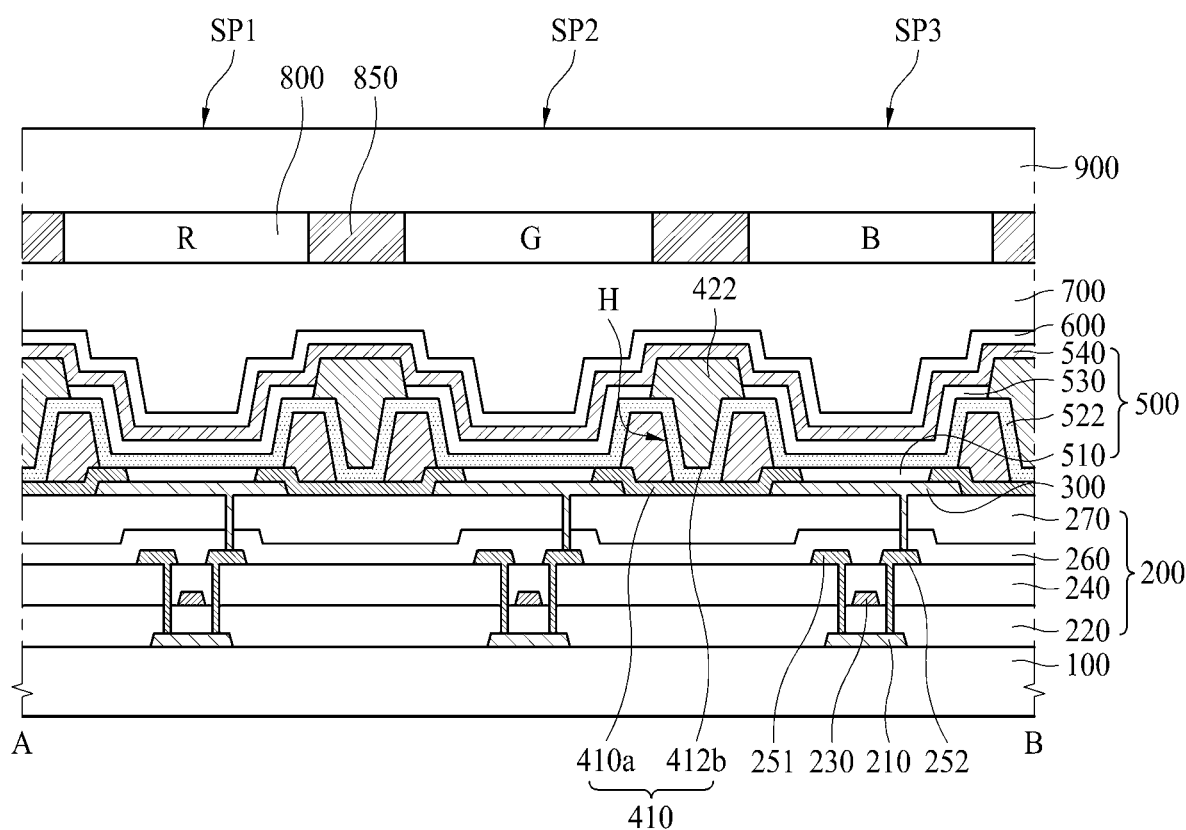
Figure 6:
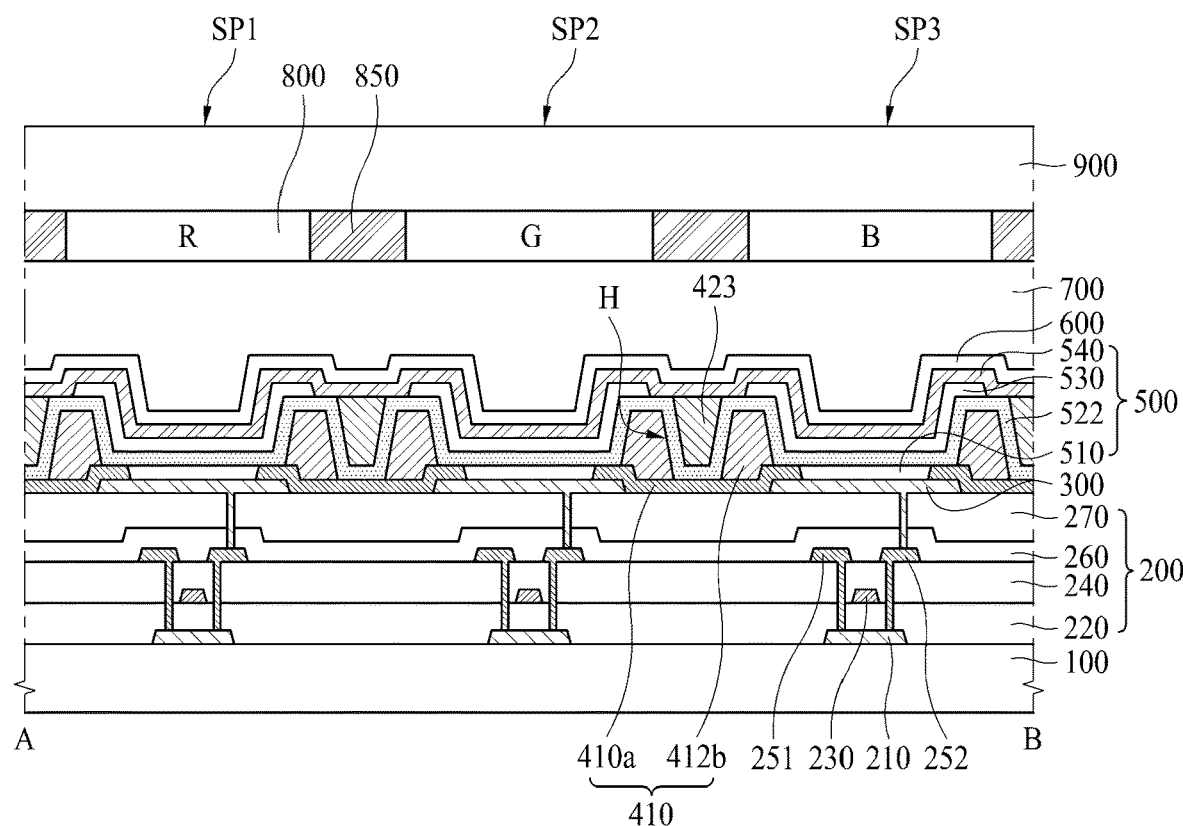

FIGS. 4 to 6 are schematic cross-sectional views of electroluminescent display devices according to various embodiments of the present disclosure.

An electroluminescent display device of FIG. 4 is different from the electroluminescent display device of FIG. 2 in that a configuration of an upper bank layer 411b of a first bank 410 is changed.

As shown in FIG. 4, a groove H is formed on an upper bank layer 411b of a first bank 410. Accordingly, a second layer 521 of a light emitting stack 500 formed on the upper bank layer 411b extends along an inner surface of the groove H, and a lower portion of the second bank 421 formed on the second layer 521 is configured to fill the groove H. The second layer 521 is formed by a deposition process.

The structure of FIG. 4 thus provides a structure having a conductive layer 300, in this example the anode, formed by a deposition process and directly on top of it is a organic light emitting stack 510 is formed by an ink jet printing step, then directly on top of organic layer 510, a second conductive layer 521 is formed by a deposition process, then directly on top of layer 510 a second organic light emitting stack is formed by an ink jet printing process.

According to the structure shown in FIG. 4, a current path of the second layer 521 of the light emitting stack 500 is increased by the groove H formed on the upper surface of the upper bank layer 411b so that it is possible to reduce an occurrence of a leakage current between a third subpixel SP3 (e.g., comprising one of the plurality of subpixels SP3) and a second subpixel SP2 (e.g., comprising one of the plurality of subpixels SP2).

An electroluminescent display device of FIG. 5 is different from the electroluminescent display device of FIG. 4 in that a configuration of a groove H formed on an upper surface of an upper bank layer 412b is changed.

Referring to FIG. 4, the groove H formed on the upper surface of the upper bank layer 411b is formed without penetrating the upper bank layer 411b, whereby the second layer 521 of the light emitting stack 500 is in contact with the upper bank layer 411b in a portion corresponding to the groove H and is not in contact with a lower bank layer 410a provided thereunder.

Meanwhile, referring to FIG. 5, a groove H formed on an upper surface of an upper bank layer 412b is formed to penetrate the upper bank layer 412b, whereby a second layer 522 of a light emitting stack 500 is in contact with a lower bank layer 410a in a portion corresponding to the groove H, and a lower portion of a second bank 422 formed on the second layer 522 is configured to fill the groove H.

In comparison to the structure of FIG. 4, the structure of FIG. 5 enables to increase a current path of the second layer 522 of the light emitting stack 500 in the portion of the groove H so that it is possible to reduce an occurrence of a leakage current between a third subpixel SP3 (e.g., comprising one of the plurality of subpixels SP3) and a second subpixel SP2 (e.g., comprising one of the plurality of subpixels SP2).

An electroluminescent display device of FIG. 6 is different from the electroluminescent display device of FIG. 5 in that a configuration of a second bank 423 is changed. Referring to FIG. 5, the upper surface of the second bank 422 is formed at a height higher than that of the second layer 522.

Meanwhile, referring to FIG. 6, an upper surface of a second bank 423 is formed at the same height as an upper surface of a second layer 522. Even though the upper surface of the second bank 423 is formed at the same height as the upper surface of the second layer 522, a third layer 530 may be disconnected on the upper surface of the second bank 423 due to the upper surface of the second bank 423 having a hydrophobic property for a solution process.

Figure 7:
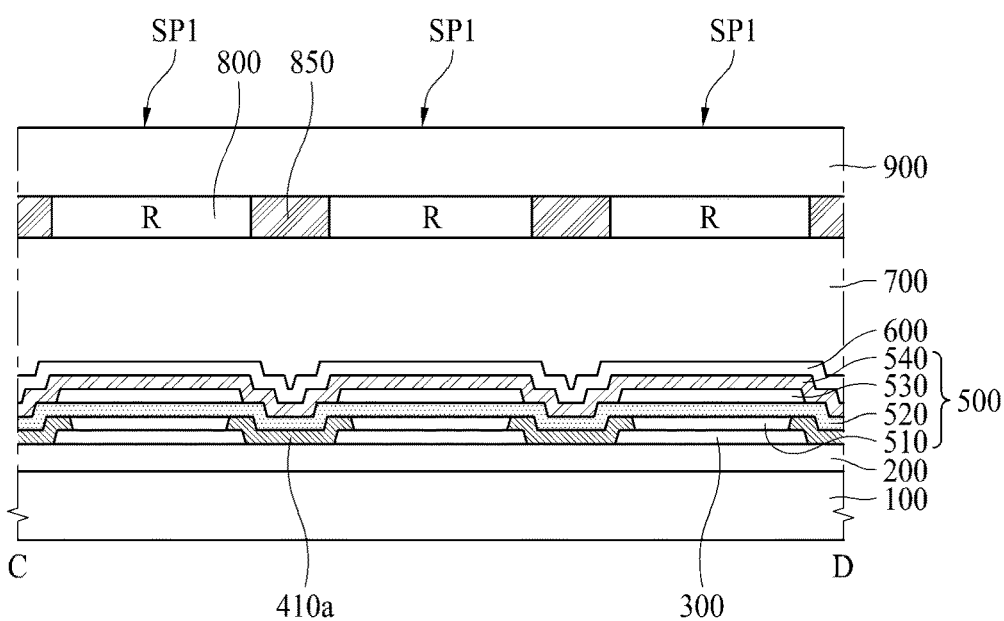
FIG. 7 is a schematic cross-sectional view illustrating the electroluminescent display device according to one embodiment of the present disclosure, which corresponds to a cross-sectional view along C-D line of FIG. 1.

FIG. 7 is a schematic cross-sectional view of an electroluminescent display device according to one embodiment of the present disclosure, which corresponds to the cross section along C-D line of FIG. 1. That is, FIG. 7 is a cross-sectional view including the boundary area between one first subpixel SP1 and another adjacent first subpixel SP1 which emit light of the same color.

As shown in FIG. 7, the electroluminescent display device according to one embodiment of the present disclosure includes a substrate 100, a circuit element layer 200, a first electrode 300, a lower bank layer 410a, a light emitting stack 500, a second electrode 600, an encapsulation layer 700, a color filter 800, a light shielding layer 850, and a protective layer 900.

Since the substrate 100, the circuit element layer 200, the first electrode 300, the second electrode 600, the encapsulation layer 700, the color filter 800, the light shielding layer 850, and the protective layer 900 are identical in structure as those of FIG. 2, a detailed description thereof may be omitted.

According to one embodiment of the present disclosure, a lower bank layer 410a of a first bank 410 is formed in the boundary area between one first subpixel SP1 and another first subpixel SP1 adjacent thereto, and an upper bank layer 410b of the first bank 410 and a second bank 420 are not formed therein.

Light of the same color is emitted from one first subpixel SP1 and another first subpixel SP1 adjacent thereto. Thus, even though a first layer 510 of a light emitting stack 500 and a third layer 530 of the light emitting stack 500 are continuous between one first subpixel SP1 and another first subpixel SP1, there is no adverse effect on image quality. Accordingly, the upper bank layer 410b and the second bank 420 may be omitted in the boundary area between one first subpixel SP1 and another first subpixel SP1 adjacent thereto.

Accordingly, a second layer 520 of the light emitting stack 500 contacts an upper surface of the lower bank layer 410a in the boundary area between one first subpixel SP1 and another first subpixel SP1 adjacent thereto. Also, a fourth layer 540 of the light emitting stack 500 contacts an upper surface of the second layer 520 of the light emitting stack 500 in the boundary area between one first subpixel SP1 and another first subpixel SP1 adjacent thereto. The layer 540 is formed by a deposition process, such as sputtering, as described elsewhere herein.

Figure 8:
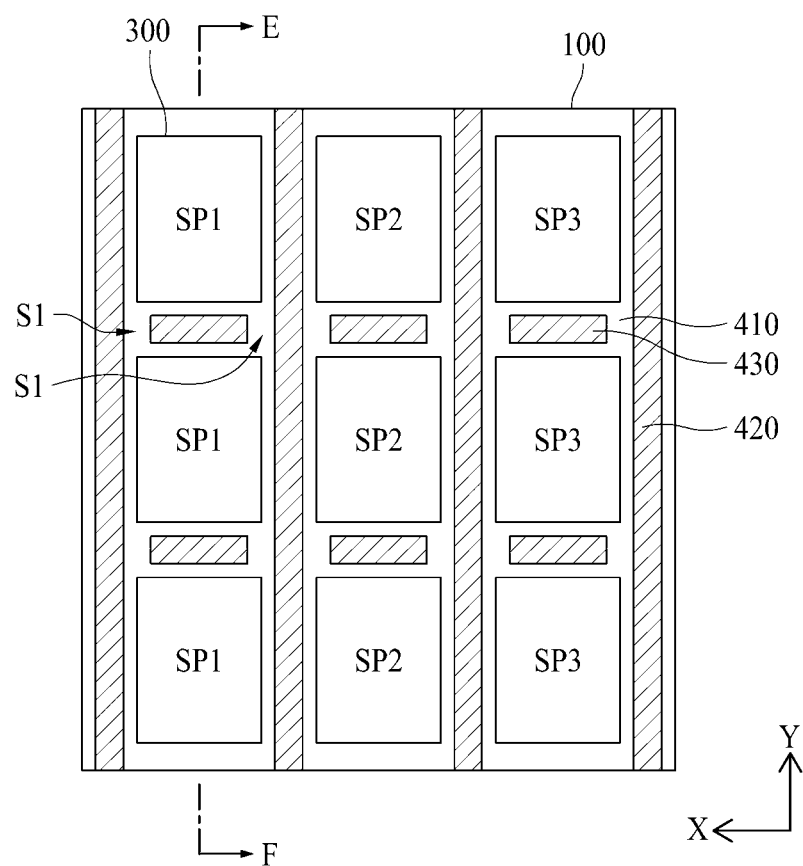
FIG. 8 is a schematic plan view illustrating an electroluminescent display device according to another embodiment of the present disclosure.

FIG. 8 is a schematic plan view of an electroluminescent display device according to another embodiment of the present disclosure. The electroluminescent display device of FIG. 8 is the same as the electroluminescent display device of FIG. 1 except that a third bank 430 is additionally provided.

As shown in FIG. 8, a third bank 430 is formed in the boundary area between one first subpixel SP1 and another adjacent first subpixel SP1 which emit light of the same color. Also, the third bank 430 is formed in the boundary area between one second subpixel SP2 and another adjacent second subpixel SP2 which emit light of the same color. In addition, the third bank 430 is formed in the boundary area between one third subpixel SP3 and another adjacent third subpixel SP3 which emit light of the same color.

Accordingly, the third bank 430 has a linear structure extending in a first direction, for example, in the X-axis direction. At this time, the third bank 430 is formed in a straight-line structure that is not continuous but discontinuous in the first direction. That is, the third bank 430 provided in the boundary area between the two adjacent first subpixels SP1 is not connected to the third bank 430 provided in the boundary area between the two adjacent second subpixels SP2. The third bank has some portions that are separate from other portions and thus is discontinuous. Examples of this can be seen in FIGS. 8, 9, 10, 11 and 12, as described herein.

The third bank 430 is not connected to a second bank 420. Accordingly, the third bank 430 is spaced apart from the second bank 420 at one side (e.g., the left side) and the other side (e.g., the right side) with a predetermined space S1 therebetween. In other words, the third bank 430 is formed in a portion except for the predetermined space S1, which corresponds to the portion between the two second banks 420 at both lateral sides with respect to the third bank 430 and corresponds to the portion in the boundary area between the two adjacent first subpixels SP1.

The third bank 430 may be formed of the same material as that of the second bank 420, but not limited thereto. The third bank 430 may be formed of a different material from that of the second bank 420.

Figure 9:
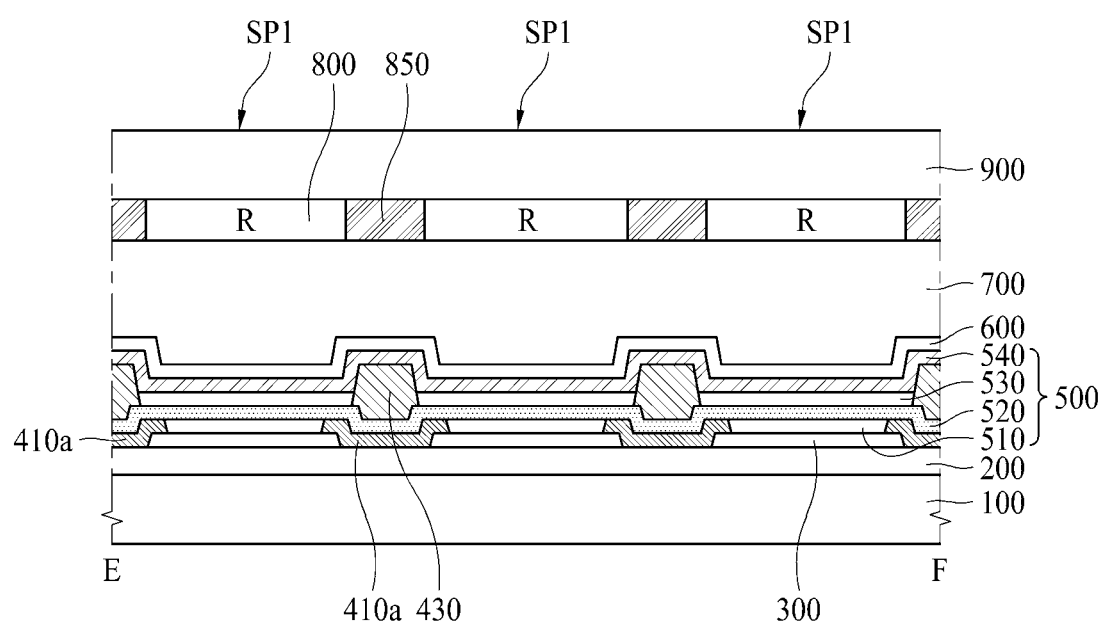
FIG. 9 is a schematic cross-sectional view illustrating the electroluminescent display device according to another embodiment of the present disclosure, which corresponds to a cross-sectional view along E-F line of FIG. 8.

FIG. 9 is a schematic cross-sectional view of the electroluminescent display device according to another embodiment of the present disclosure, which corresponds to the cross section along E-F line of FIG. 8. That is, FIG. 9 is a cross-sectional view including the boundary area between one first subpixel SP1 and another adjacent first subpixel SP1 that emit light of the same color.

As shown in FIG. 9, the electroluminescent display device according to another embodiment of the present disclosure includes a substrate 100, a circuit element layer 200, a first electrode 300, a lower bank layer 410a, a third bank 430, a light emitting stack 500, a second electrode 600, an encapsulation layer 700, a color filter 800, a light shielding layer 850, and a protective layer 900.

Since the substrate 100, the circuit element layer 200, the first electrode 300, the second electrode 600, the encapsulation layer 700, the color filter 800, the light-shielding layer 850, and the protective layer 900 are identical in structure as those of FIG. 7, a detailed description thereof may be omitted.

According to another embodiment of the present disclosure, the lower bank layer 410a of the first bank 410 and the third bank 430 are formed in the boundary area between one first subpixel SP1 and another first subpixel SP1 adjacent thereto.

In this case, the third bank 430 is disposed between the second layer 520 and the fourth layer 540 of the light emitting stack 500, in the same manner as the above-described second bank 420.

Accordingly, the second layer 520 of the light emitting stack 500 contacts the entire upper surface of the lower bank layer 410a in the boundary area between one first subpixel SP1 and another first subpixel SP1 adjacent thereto. Also, the fourth layer 540 of the light emitting stack 500 contacts the upper surface of the third bank 430 in the boundary area between one first subpixel SP1 and another first subpixel SP1 adjacent thereto.

Therefore, the third bank 430 may prevent the third layer 530 of the light emitting stack 500 formed in one first subpixel SP1 from spreading to another adjacent first subpixel SP1. To this end, the upper surface of the third bank 430 may have a hydrophobic property. However, the upper surface of the third bank 430 may be formed to have a hydrophilic property.

Referring once again to FIG. 8, according to another embodiment of the present disclosure, the third bank 430 is spaced apart from the second bank 420 with the predetermined space S1. For a solution process of forming the third layer 530 of the light emitting stack 500, a solution is smoothly moved through the predetermined space S1, thereby preventing stains.

More specifically, according as the third bank 430 is formed, the third layer 530 of the light emitting stack 500 may be separated between the two adjacent first subpixels SP1. At this time, if the third bank 430 is formed in a continuous straight-line structure in the first direction while being in contact with the second bank 420, the solution for forming the third layer 530 of the light emitting stack 500 is trapped in each of the first subpixels SP1, whereby the solution does not move between the neighboring first subpixels SP1. In this case, when the amount of the solution sprayed from an inkjet is not precisely adjusted, the amount of the solution in the specific first subpixel SP1 may be more or less than a predetermined reference value, whereby stains may be generated therein.

In another embodiment of the present disclosure, since the third bank 430 is spaced apart from the second bank 420 with the predetermined space S1 therebetween, the stain generation problem may be prevented. Specifically, even though the amount of the solution sprayed from the ink jet is not precisely adjusted, the solution may be moved between the first subpixels SP1 adjacent to each other through the predetermined space S1, thereby solving a problem related with the sprayed amount of solution which is not precisely adjusted, thereby preventing a problem of a stain generation.

Figure 10:
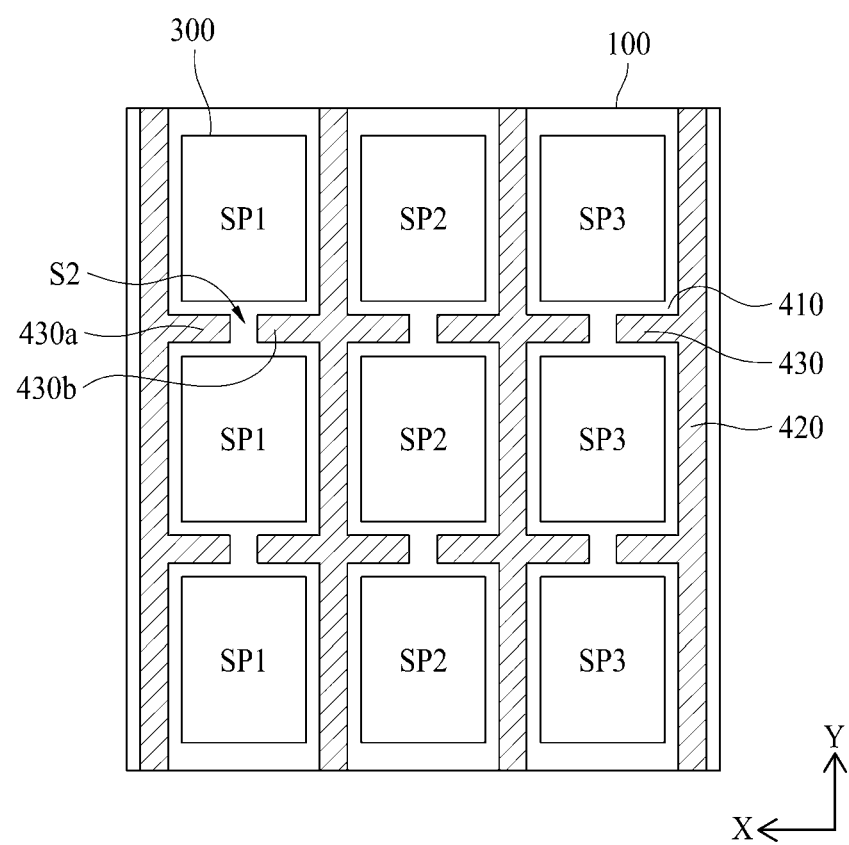
FIGS. 10 to 12 are schematic plan views illustrating electroluminescent display devices according to various embodiments of the present disclosure.
Figure 11:
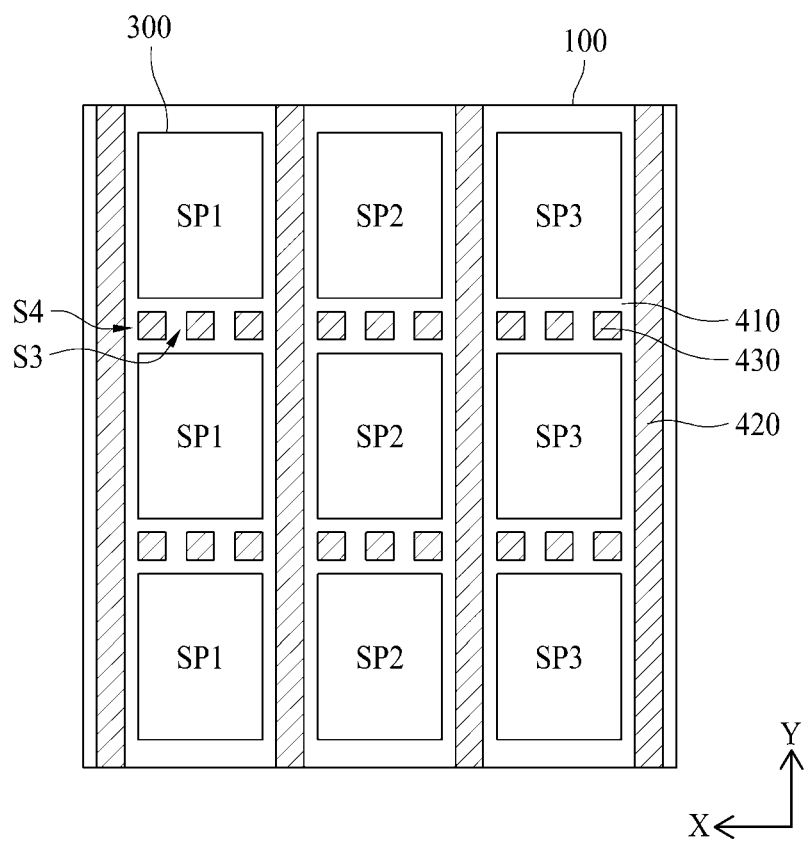
Figure 12:
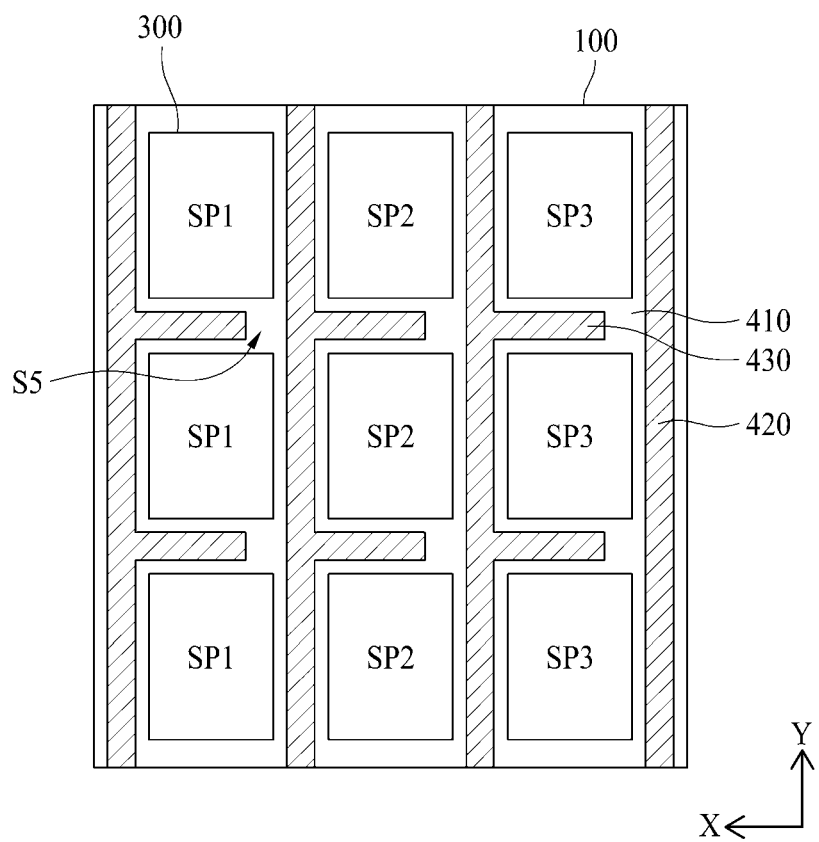

FIGS. 10 to 12 are schematic plan views of electroluminescent display devices according to various embodiments of the present disclosure. The electroluminescent display devices of FIGS. 10 to 12 are different from the electroluminescent display device of FIG. 8 in that a third bank (430) and a structure of a predetermined space S2 is changed.

In the same manner as FIG. 8, as shown in FIGS. 10 to 12, a third bank 430 is formed in a portion except for a predetermined space S2, which corresponds to the portion between the two second banks 420 at both lateral sides with respect to the third bank 430 and corresponds to the portion in the boundary area between two adjacent first subpixels SP1.

In this case, referring to FIG. 10, the third bank 430a of one side (e.g., the left side) extends to the other direction (e.g., the right direction) from a second bank 420 of one side (e.g., the left side), and the third bank 430b of the other side (e.g., the right side) extends to one direction (e.g., the left direction) from the second bank 420 of the other side (e.g., the right side), and the third bank 430a of one side is spaced apart from the third bank 430b of the other side with a predetermined space S2.

Referring to FIG. 11, a plurality of third banks 430 are spaced apart from each other with a predetermined space S3 therebetween, and the third bank 430 disposed most adjacent to one side (e.g., left side) and the third bank 430 disposed most adjacent to the other side (e.g., right side) are spaced apart from a second bank 420 with a predetermined space S4 therebetween.

Referring to FIG. 12, a third bank 430 extends from one side (e.g., the left side) of a second bank 420 to the other side (e.g., the right direction), and the third bank 430 is not connected to the second bank 420 of the other side (e.g., the right side) and is spaced apart from the second bank 420 with a predetermined space S5 therebetween.

As described above, the positions of the predetermined spaces S1, S2, S3, S4, and S5 may be variously changed in the boundary area between the two adjacent first subpixels SP1.

Accordingly, the present disclosure may have the following advantages.

According to one embodiment of the present disclosure, the first layer of the light emitting stack that needs to be separated for each subpixel is formed by the solution process such as the ink jet process, and the first layer of the light emitting stack is disconnected for each subpixel by the first bank, so that the first layer of the light emitting stack is not continuous for each subpixel.

According to one embodiment of the present disclosure, the second layer and the fourth layer of the light emitting stack that need not be separated for each subpixel may be formed without the mask by the vacuum deposition method such as the evaporation method.

According to one embodiment of the present disclosure, the second bank is additionally formed on the second layer of the light emitting stack, so that the third layer of the light emitting stack that needs to be separated for each subpixel is formed by the solution process such as the ink jet process and is disconnected by the second bank while being not to be continuous for each adjacent subpixel.

According to another embodiment of the present disclosure, the third bank is formed in the boundary area between one subpixel and another adjacent subpixel which emit light of the same color, and the predetermined space for movement of the ink is secured, thereby improving fluidity of the light emitting stack, thereby preventing stains from occurring in the specific subpixel.

It will be apparent to those skilled in the art that various substitutions, modifications, and variations are possible within the scope of the present disclosure without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a substrate including a first subpixel and a second subpixel arranged in a first direction;
a first electrode provided in each of the first subpixel and the second subpixel on the substrate;
a bank provided in a boundary area between the first subpixel and the second subpixel on the substrate;
a light emitting stack provided on the first electrode; and
a second electrode provided on the light emitting stack,
wherein the bank includes a first bank and a second bank positioned on the first bank,
the light emitting stack includes a first layer provided in each of the first subpixel and the second subpixel, and a second layer disposed on the first layer, the second layer extending continuously from the first subpixel to the second subpixel, and
the first bank is disposed under the second layer, and the second bank is disposed on the second layer,
wherein the light emitting stack further includes a third layer disposed on the second layer and provided in each of the first subpixel and the second subpixel,
wherein the first layer provided in the first subpixel and the first layer provided in the second subpixel are disconnected from each other with the first bank interposed therebetween, and
the third layer provided in the first subpixel and the third layer provided in the second subpixel are disconnected from each other with the second bank interposed therebetween.

2. The electroluminescent display device according to claim 1, wherein the first bank and the second bank are spaced apart from each other in an up-and-down direction while being not in contact to each other with the second layer interposed therebetween.

3. The electroluminescent display device according to claim 1,
wherein the light emitting stack further includes a fourth layer disposed on the third layer and continuously provided from the first subpixel to the second subpixel.

4. The electroluminescent display device according to claim 3, wherein the second layer and the fourth layer are spaced apart from each other in an up-and-down direction while being not in contact to each other with the second bank interposed therebetween.

5. The electroluminescent display device according to claim 3, wherein the light emitting stack includes a first stack for emitting light of a first color, a second stack for emitting light of a second color, and a charge generating layer provided between the first stack and the second stack,
the first stack includes the first layer, and
the second stack includes the third layer.

6. The electroluminescent display device according to claim 5,
wherein the first stack includes a hole injection layer, a first hole transport layer, a first light emitting stack, and a first electron transport layer,
the second stack includes a second hole transport layer, a second light emitting stack, a second electron transport layer, and an electron injection layer,
the charge generating layer includes an N-type charge generating layer and a P-type charge generating layer,
the first layer includes the hole injection layer, the first hole transport layer, and the first light emitting stack,
the second layer includes the first electron transport layer, the N-type charge generating layer, and the P-type charge generating layer,
the third layer includes the second hole transport layer and the second light emitting stack, and
the fourth layer includes the second electron transport layer and the electron injection layer.

7. The electroluminescent display device according to claim 1,
wherein a lower portion of the first bank has a hydrophilic property, and
an upper surface of the first bank and an upper surface of the second bank have a hydrophobic property.

8. The electroluminescent display device according to claim 1,
wherein a groove is provided on an upper surface of the first bank, and the second layer extends along an inner surface of the groove, and the second bank is provided to fill the groove.

9. The electroluminescent display device according to claim 1, wherein a height of an upper surface of the second bank is higher than a height of an upper surface of the second layer.

10. The electroluminescent display device according to claim 1,
wherein the substrate further includes a separate first subpixel arranged adjacent to the first subpixel in a second direction and configured to emit light of the same color as the first subpixel, and
a third bank is additionally provided in the boundary area between the first subpixel and the separate first subpixel.

11. The electroluminescent display device according to claim 10, wherein the third bank is disposed at a portion except for a predetermined space in the boundary area between the first subpixel and the separate first subpixel.

12. The electroluminescent display device according to claim 10,
wherein the light emitting stack further includes a fourth layer disposed on the third layer and continuously provided from the first subpixel to the second subpixel,
the third layer provided in the first subpixel and the third layer provided in the separate first subpixel are disconnected from each other with the third bank interposed therebetween, and
the second layer and the fourth layer are spaced apart from each other in an up-and-down direction while being not in contact to each other with the third bank interposed therebetween.

13. The electroluminescent display device according to claim 10,
wherein the first bank is additionally provided in the boundary area between the first subpixel and the separate first subpixel,
the first bank provided in the boundary area between the first subpixel and the second subpixel includes a lower bank layer and an upper bank layer, and
the first bank provided in the boundary area between the first subpixel and the separate first subpixel includes only the lower bank layer.

14. An electroluminescent display device, comprising:
a substrate including a plurality of first subpixels and a plurality of second subpixels;
a first bank disposed in the boundary area between the plurality of first subpixels and the plurality of second subpixels, the boundary area between each of the plurality of first subpixels, and the boundary area between each of the plurality of second subpixels;
a second bank disposed along the boundary area between the plurality of first subpixels and the plurality of second subpixels; and
a third bank disposed in a discontinuous linear structure in the boundary area between each of the plurality of first subpixels and the boundary area between each of the plurality of second subpixels,
further comprising a light emitting stack including a first layer, a second layer, and a third layer sequentially stacked,
wherein the first layer and the third layer are provided to be disconnected in the plurality of first subpixels and the plurality of second subpixels, and
the second layer is provided continuously from the plurality of first subpixels to the plurality of second subpixels.

15. The electroluminescent display device according to claim 14,
wherein the third bank is disposed at a portion except for a predetermined space in the boundary area between the plurality of first subpixels.

16. The electroluminescent display device according to claim 15,
wherein the third bank is spaced apart from the second bank with the predetermined space therebetween.

17. The electroluminescent display device according to claim 15,
wherein the third bank is extending from the second bank while being in contact with the second bank.

18. The electroluminescent display device according to claim 14, wherein the light emitting stack further includes a fourth layer on the third layer, and wherein the fourth layer is provided continuously from the plurality of first subpixels to the plurality of second subpixels.

19. The electroluminescent display device according to claim 18, wherein the first bank and the second bank are spaced apart from each other in an up-and-down direction with the second layer interposed therebetween, and the first bank and the third bank are spaced apart from each other in an up-and-down direction with the second layer interposed therebetween.

20. An electroluminescent display device, comprising:

a first portion of a first light emitting stack disposed above a substrate;

a second portion of the first light emitting stack disposed above the substrate, the first portion of the first light emitting stack being disconnected from the second portion of the first light emitting stack;

a first bank disposed between the first portion of the first light emitting stack and the second portion of the first light emitting stack;

a conductive layer disposed above the first bank, the first portion of the first light emitting stack and the second portion of the first light emitting stack;

a first portion of a second light emitting stack being disposed above the conductive layer;

a second portion of the second light emitting stack being disposed above the conductive layer, the first portion of the second light emitting stack being disconnected from the second portion of the second light emitting stack; and a second bank disposed on the conductive layer and positioned between the first portion of the second light emitting stack and the second portion of the second light emitting stack.

21. The electroluminescent display device of claim 20 wherein the conducive layer is a charge generating layer.

22. The electroluminescent display device of claim 20, wherein:

the first portion of the first light emitting stack is associated with a first subpixel; and the second portion of the first light emitting stack is associated with a second subpixel.

23. The electroluminescent display device of claim 21, further comprising:

a first color filter disposed above the first portion of the first light emitting stack; and a second color filter disposed above the second portion of the first light emitting stack.

24. The electroluminescent display device of claim 20, wherein:

the second bank is disposed above the conductive layer.

25. The electroluminescent display device of claim 20, wherein:

a height of the first bank is greater than a height of the first portion of a first light emitting stack.

26. The electroluminescent display device of claim 20, wherein:

the first bank includes a groove and the charge generating layer extends along an inner surface of the groove.

27. The electroluminescent display device of claim 20, further comprising:

a thin film transistor disposed above the substrate, the first portion of the first light emitting stack is disposed above the thin film transistor.

28. The electroluminescent display device of claim 20, wherein:

the first bank is comprised of one of an insulating material or a hydrophobic material.

29. The electroluminescent display device of claim 20 wherein:

the first portion of a first light emitting stack is in a first subpixel and the second portion of the first light emitting layer is in a second subpixel spaced from the first subpixel.

* * * * *